US006995026B2

(12) United States Patent
Moxham et al.

(10) Patent No.: US 6,995,026 B2
(45) Date of Patent: Feb. 7, 2006

(54) METHODS FOR COUPLING A FLOWABLE CONDUCTIVE MATERIAL TO MICROELECTRONIC SUBSTRATES

(75) Inventors: Stephen Moxham, Boise, ID (US); William Stephenson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/775,736

(22) Filed: Feb. 10, 2004

(65) Prior Publication Data

US 2004/0159921 A1   Aug. 19, 2004

Related U.S. Application Data

(62) Division of application No. 10/034,924, filed on Dec. 26, 2001, now Pat. No. 6,870,276.

(51) Int. Cl.
*G01R 31/26* (2006.01)
*H01L 21/66* (2006.01)

(52) U.S. Cl. .............................. 438/17; 438/14; 438/18
(58) Field of Classification Search .................. 438/14, 438/17, 18
See application file for complete search history.

(56) References Cited

U.S. PATENT DOCUMENTS

| 5,062,565 | A | 11/1991 | Wood et al. |
| 5,128,831 | A | 7/1992 | Fox, III et al. |
| 5,145,099 | A | 9/1992 | Wood et al. |
| 5,255,156 | A | 10/1993 | Chang |
| 5,286,679 | A | 2/1994 | Farnworth et al. |
| 5,444,303 | A | 8/1995 | Greenwood et al. |
| 5,504,373 | A | 4/1996 | Oh et al. |
| 5,544,124 | A | 8/1996 | Zagar et al. |
| 5,554,940 | A | 9/1996 | Hubacher |
| 5,593,927 | A | 1/1997 | Farnworth et al. |
| 5,642,262 | A | 6/1997 | Terrill et al. |
| 5,656,863 | A | 8/1997 | Yasunaga et al. |

(Continued)

FOREIGN PATENT DOCUMENTS

DE    196 00 401 A1    7/1997

(Continued)

OTHER PUBLICATIONS

Van Zant, Peter, "Microchip Fabrication: A Practical Guide to Semiconductor Processing," p. 545, McGraw-Hill, New York, Third Edition, Oct. 1996, ISBN: 0070672504.

(Continued)

*Primary Examiner*—Laura M. Schillinger
*Assistant Examiner*—Heather Doty
(74) *Attorney, Agent, or Firm*—Perkins Coie LLP

(57) ABSTRACT

A method and apparatus for supporting a microelectronic substrate. The apparatus can include a microelectronic substrate and a support member carrying the microelectronic substrate. The apparatus can further include a first connection structure carried by the support member. The first connection structure can have a first bond site configured to receive a flowable conductive material, and can further have at least two first elongated members connected and extending outwardly from the first bond site. Each first elongated member can be configured to receive at least a portion of the flowable conductive material from the first bond site, with none of the first elongated members being electrically coupled to the microelectronic substrate. The assembly can further include a second connection structure that is electrically coupled to the microelectronic substrate and that can include second elongated members extending away from a second bond site. The number of second elongated members can be equal to the number of first elongated members.

37 Claims, 12 Drawing Sheets

U.S. PATENT DOCUMENTS

| | | |
|---|---|---|
| 5,677,566 A | 10/1997 | King et al. |
| 5,723,906 A | 3/1998 | Rush |
| 5,734,559 A | 3/1998 | Banerjee et al. |
| 5,792,594 A | 8/1998 | Brown et al. |
| 5,826,628 A | 10/1998 | Hamilton |
| 5,843,799 A | 12/1998 | Hsu et al. |
| 5,879,965 A | 3/1999 | Jiang et al. |
| 5,891,797 A | 4/1999 | Farrar |
| 5,936,844 A | 8/1999 | Walton |
| 5,946,314 A | 8/1999 | Licciardi et al. |
| 5,946,553 A | 8/1999 | Wood et al. |
| 5,986,209 A | 11/1999 | Tandy |
| 5,990,566 A | 11/1999 | Farnworth et al. |
| RE36,469 E | 12/1999 | Wood et al. |
| 6,018,249 A | 1/2000 | Akram et al. |
| 6,020,624 A | 2/2000 | Wood et al. |
| 6,025,728 A | 2/2000 | Hembree et al. |
| 6,048,744 A | 4/2000 | Corisis et al. |
| 6,048,755 A | 4/2000 | Jiang et al. |
| 6,072,233 A | 6/2000 | Corisis et al. |
| 6,089,920 A | 7/2000 | Farnworth et al. |
| 6,097,087 A | 8/2000 | Farnworth et al. |
| 6,103,547 A | 8/2000 | Corisis et al. |
| 6,107,122 A | 8/2000 | Wood et al. |
| 6,108,210 A | 8/2000 | Chung |
| 6,111,205 A | 8/2000 | Leddige et al. |
| 6,118,179 A | 9/2000 | Farnworth et al. |
| 6,130,474 A | 10/2000 | Corisis |
| 6,133,068 A | 10/2000 | Kinsman |
| 6,133,622 A | 10/2000 | Corisis et al. |
| 6,148,509 A | 11/2000 | Schoenfeld et al. |
| 6,150,710 A | 11/2000 | Corisis |
| 6,150,717 A | 11/2000 | Wood et al. |
| 6,153,924 A | 11/2000 | Kinsman |
| 6,159,764 A | 12/2000 | Kinsman et al. |
| 6,180,504 B1 | 1/2001 | Farnworth et al. |
| 6,188,232 B1 | 2/2001 | Akram et al. |
| 6,201,304 B1 | 3/2001 | Moden |
| 6,201,305 B1 | 3/2001 | Darveaux et al. |
| 6,214,716 B1 | 4/2001 | Akram |
| 6,221,750 B1 | 4/2001 | Fjelstad |
| 6,225,689 B1 | 5/2001 | Moden et al. |
| 6,228,548 B1 | 5/2001 | King et al. |
| 6,229,202 B1 | 5/2001 | Corisis |
| 6,232,147 B1 | 5/2001 | Matsuki et al. |
| 6,232,666 B1 | 5/2001 | Corisis et al. |
| 6,235,552 B1 | 5/2001 | Kwon et al. |
| 6,239,489 B1 | 5/2001 | Jiang |
| 6,246,108 B1 | 6/2001 | Corisis et al. |
| 6,246,110 B1 | 6/2001 | Kinsman et al. |
| 6,247,629 B1 | 6/2001 | Jacobson et al. |
| 6,258,623 B1 | 7/2001 | Moden et al. |
| 6,258,624 B1 | 7/2001 | Corisis |
| 6,259,153 B1 | 7/2001 | Corisis |
| 6,261,865 B1 | 7/2001 | Akram |
| 6,265,766 B1 | 7/2001 | Moden |
| 6,271,580 B1 | 8/2001 | Corisis |
| 6,277,660 B1 * | 8/2001 | Zakel et al. ............... 438/14 |
| 6,281,042 B1 | 8/2001 | Ahn et al. |
| 6,284,571 B1 | 9/2001 | Corisis et al. |
| 6,285,204 B1 | 9/2001 | Farnworth |
| 6,291,894 B1 | 9/2001 | Farnworth et al. |
| 6,297,547 B1 | 10/2001 | Akram |
| 6,300,782 B1 * | 10/2001 | Hembree et al. ........ 324/760 |
| 6,303,981 B1 | 10/2001 | Moden |
| 6,303,985 B1 | 10/2001 | Larson et al. |
| 6,310,390 B1 | 10/2001 | Moden |
| 6,326,698 B1 | 12/2001 | Akram |
| 6,329,222 B1 | 12/2001 | Corisis et al. |
| 6,329,705 B1 | 12/2001 | Ahmad |
| 6,331,221 B1 | 12/2001 | Cobbley |
| 6,331,448 B1 | 12/2001 | Ahmad |
| 6,344,976 B1 | 2/2002 | Schoenfeld et al. |
| 6,362,087 B1 | 3/2002 | Wang et al. |
| 6,380,555 B1 | 4/2002 | Hembree et al. |
| 6,391,681 B1 | 5/2002 | Corisis |
| 6,392,291 B1 | 5/2002 | Corisis |
| 6,407,459 B2 | 6/2002 | Kwon et al. |
| 6,410,990 B2 | 6/2002 | Taylor et al. |
| 6,429,528 B1 | 8/2002 | King et al. |
| 6,455,408 B1 | 9/2002 | Hwang et al. |
| 6,477,046 B1 | 11/2002 | Stearns et al. |
| 6,682,948 B2 * | 1/2004 | Wada ........................ 438/17 |
| 2002/0017711 A1 | 2/2002 | Kwon et al. |
| 2002/0139578 A1 | 10/2002 | Alcoe et al. |
| 2002/0195345 A1 | 12/2002 | Bensten et al. |
| 2002/0195614 A1 | 12/2002 | Tay et al. |
| 2003/0030965 A1 | 2/2003 | Chua et al. |

FOREIGN PATENT DOCUMENTS

| | | |
|---|---|---|
| DE | 197 14 470 A1 | 12/1997 |
| EP | 0 398 628 A2 | 11/1990 |
| EP | 0 398 628 A3 | 11/1990 |
| EP | 0 413 451 A2 | 2/1991 |
| EP | 0 413 451 A3 | 2/1991 |
| WO | WO 92/17901 A1 | 10/1992 |

OTHER PUBLICATIONS

Harper, Charles A. and Miller, Martin B., "Electronic Packaging, Microelectronics, and Interconnection Dictionary," p. 211, McGraw-Hill, New York, Feb. 1993, ISBN: 0070266883.

Kohl, James E. et al., "Low Cost Chip Scale Packaging and Interconnect Technology," 7 pages, Proceedings of the Surface Mount International Conference, San Jose, California, Sep. 1997, <http://www.epic-tech.com/smtppr.pdf>.

Kohl, James E. et al., "EPIC CSP™ Assembly and Reliability Methods," 5 pages, Proceedings of CSI98, Santa Clara, California, May 1998, <http://www.epic-tech.com/cspi982.pdf>.

Singer, Adam, T. et al., "Cost Considerations for CSP Variations," 9 pages, presented at Chip Scale International, San Jose, California, May 1998, <http://www.epic-tech.com/ibis_papr.pdf>.

Tessier, Theodore G. et al., "Technologies and Trends in Wafer Level Packaging," 15 pages. Future Fab International, vol. 11, Jun. 29, 2001, <http://www.future-fab.com/documents/asp?d_ID=660>.

Lau, John H., "Ball Grid Array Technology," McGraw-Hill, Inc., Chapter 8, "Reliability of Ceramic Ball Grid Array Assembly," 1995, pp. 224-265.

U.S. Appl. No. 10/034,924, filed Dec. 26, 2001, Moxham et al.

U.S. Appl. No. 10/153,086, filed May 22, 2002, King et al.

U.S. Appl. No. 10/775,703, filed Feb. 10, 2004, Moxham et al.

* cited by examiner

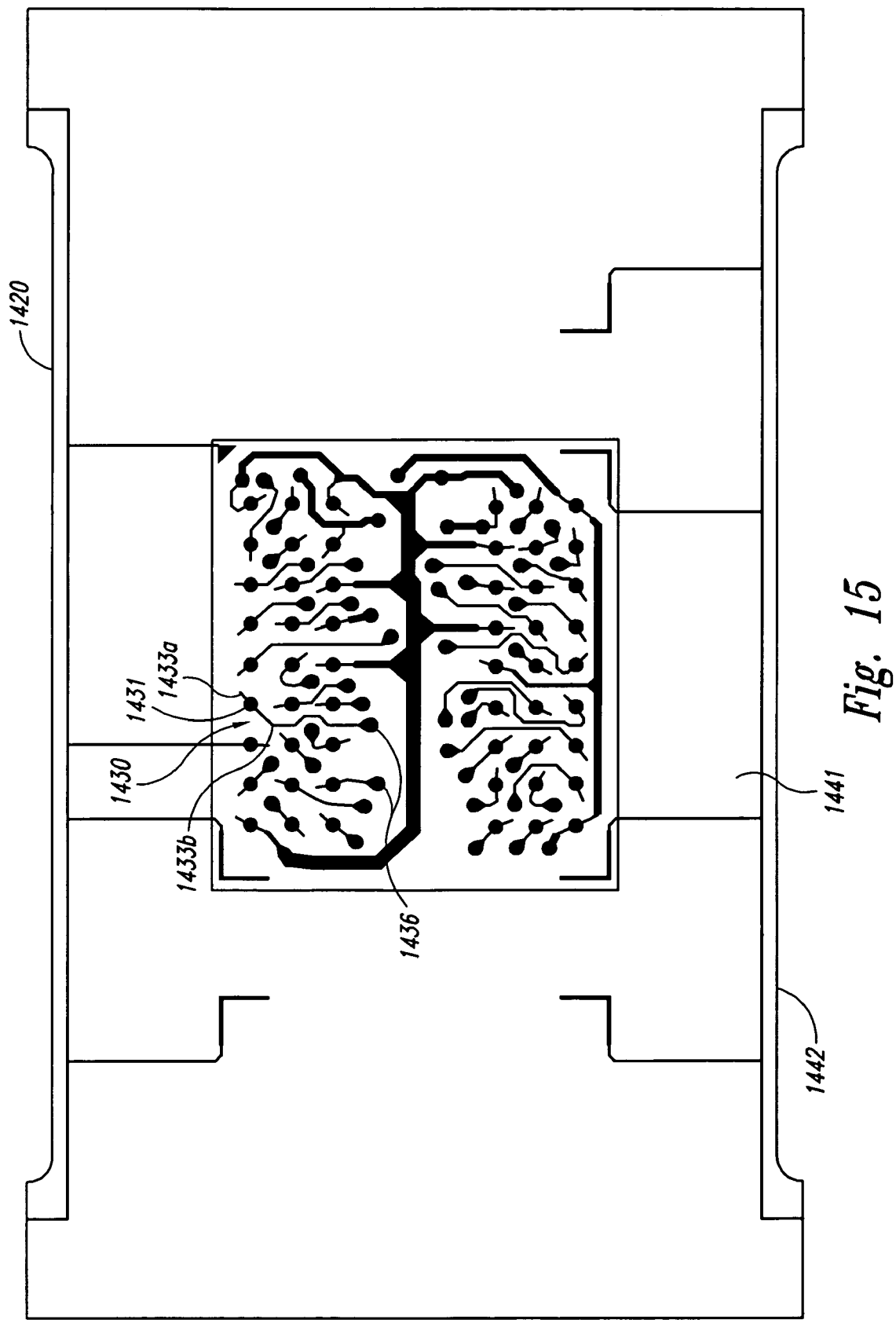

METHODS FOR COUPLING A FLOWABLE CONDUCTIVE MATERIAL TO MICROELECTRONIC SUBSTRATES

This application is a divisional application of U.S. patent application Ser. No. 10/034,924, filed Dec. 26, 2001, entitled "APPARATUS FOR SUPPORTING MICROELECTRONIC SUBSTRATES," now U.S. Pat. No. 6,870,276, issued Mar. 22, 2005; and is related to U.S. application Ser. No. 10/775,703, filed Feb. 10, 2004, entitled "MICROELECTRONIC ASSEMBLIES, ELECTRONIC DEVICES, AND APPARATUSES FOR SUPPORTING MICROELECTRONIC SUBSTRATES," which is a divisional application of U.S. application Ser. No. 10/034,924; both of which are herein incorporated by reference in their entireties.

BACKGROUND

The present invention is directed toward methods and apparatuses for supporting microelectronic substrates. Conventional microelectronic device packages typically include a microelectronic substrate mounted on a support member and packaged with an encapsulant. In one conventional arrangement shown in FIG. 1, a microelectronic device package 10 can include a support member 20 having a front surface 21 and a rear surface 22 facing opposite the front surface 21. The support member 20 can also have a slot 23 extending from the front surface 21 to the rear surface 22. A microelectronic substrate 40 (visible through the slot 23) is attached to the rear surface 22, and has wire bond pads 41 that are accessible through the slot 23 for coupling to the support member 20. Accordingly, the support member 20 can include active trace patterns 30, each of which has a wire bond pad 32, a ball bond pad 31, and a connecting trace 33 extending between the wire bond pad 32 and the ball bond pad 31. Each active trace pattern 30 can also include an electroplating trace 34 coupled to an electroplating bus 24 to provide electrically conductive coatings on the active trace pattern 30 during the formation of the support member 20.

In operation, the wire bond pads 32 of the active trace patterns 30 are connected to corresponding wire bond pads 41 of the microelectronic substrate 40 with wire bonds 42. A solder ball (not shown in FIG. 1) can then be disposed on each ball bond pad 31. The wire bonds 42 and the wire bond pads 41 and 32 can then be covered with an encapsulating material for protection, while the solder balls remain exposed. The exposed solder balls can be connected to other devices to provide for communication between those devices and the packaged microelectronic substrate 40.

In order to conform with industry standards, similar device packages 10 are often required to have the same number of solder balls, even if not all the solder balls are required to provide communication with the microelectronic substrate 40. Accordingly, the support member 20 can include inactive trace patterns 50. Each inactive trace pattern 50 can include a ball bond pad 51 that supports a solder ball, and an electroplating trace 54 for electroplating conductive coatings on the inactive trace pattern 50. The inactive trace patterns 50 do not include a wire bond pad 32 or a corresponding connecting trace 33. Accordingly, the inactive trace patterns 50 do not provide electrical communication to or from the microelectronic substrate 40. However, the inactive trace patterns 50 can support solder balls which, together with the solder balls on the active trace patterns 30, define a uniform pattern of solder balls that can be compatible with a variety of devices in which the package 10 is installed and/or tested.

FIG. 2 illustrates a conventional test apparatus 60 for testing device packages such as the package 10 described above with reference to FIG. 1. In one aspect of this arrangement, the test apparatus 60 can include a base 61 that supports the device package 10. An overlying frame 62 secures the package 10 to the base 61. When the package 10 is secured to the base 61, solder balls 25 of the package 10 remain exposed through an opening 65 in the frame 62. A test jig 63 is then aligned with the base 61 such that test contacts 64 of the jig 63 make physical and electrical contact with the solder balls 25 of the package 10. The test jig 63 is then used to test the operational characteristics of the device package 10.

One drawback with the foregoing arrangement is that the test jig 63 can partially or completely dislodge some of the solder balls 25 and/or the trace patterns to which the solder balls 25 are connected. The dislodged solder balls 25 and/or trace patterns can increase the incidence of short circuits in the package 10, and accordingly packages with these defects are typically discarded.

SUMMARY

The present invention is directed toward methods and apparatuses for supporting microelectronic substrates. An apparatus in according with one aspect of the invention includes a microelectronic substrate, a support member carrying the microelectronic substrate, and a connection structure carried by the support member. The connection structure can have a bond site configured to receive a flowable conductive material, such as solder, and the connection site can further have at least two elongated members connected to and extending outwardly from the bond site. Each elongated member can be configured to receive at least a portion of the flowable conductive material from the bond site, and none of the elongated members is electrically coupled to the microelectronic substrate.

In a further aspect of the invention, the connection structure can be a first connection structure and the elongated members can be first elongated members. The apparatus can include a second connection structure carried by the support member and having a second bond site configured to receive a flowable conductive material. The second connection structure can be electrically coupled to the microelectronic substrate and can have second elongated members extending outwardly from the second bond site, with each of the second elongated members configured to receive at least a portion of the flowable conductive material from the second bond site. The number of second elongated members for each second connection structure can equal the number of first elongated members for the first connection structure.

The invention is also directed to a method for coupling a flowable conductive material to a microelectronic substrate. The method can include aligning a support member to receive the flowable conductive material, with the support member having a support surface configured to carry a microelectronic substrate, and further having a first connection structure and second connection structure. The first connection structure can have a first bond site configured to receive the flowable conductive material and can be configured to remain decoupled from the microelectronic substrate when a support member carries the microelectronic substrate. The second connection structure can have a second bond site configured to receive the flowable conductive material, and can be configured to be electrically coupled to the microelectronic substrate when the support member carries the microelectronic substrate. The method can further include disposing a first quantity of the flowable conductive material on the first bond site, wicking a first portion of the first quantity of flowable material along first elongated members connected to and extending outwardly from the first bond site, and disposing a second quantity of the flowable conductive material on the second bond site. The method can further include wicking a second portion of the second quantity of flowable conductive material along second elongated members extending outwardly from the second bond site, with the second portion of the flowable conductive material having a volume approximately equal to a volume of the first portion. The first quantity of flowable conductive material can form a first conductive coupler, the second quantity can form a second conductive coupler, and each conductive coupler can project from the support member by approximately the same distance.

BRIEF DESCRIPTION OF THE DRAWINGS

FIG. 15 is a bottom plan view of the support member shown in FIG. 14 in accordance with an embodiment of the invention.

DETAILED DESCRIPTION

The present disclosure describes packaged microelectronic substrates and methods for forming such packages. The term "microelectronic substrate" is used throughout to include substrates upon which and/or in which microelectronic circuits or components, data storage elements or layers, and/or vias or conductive lines are or can be fabricated. Many specific details of certain embodiments of the invention are set forth in the following description and in FIGS. 3A–9 to provide a thorough understanding of these embodiments. One skilled in the art, however, will understand that the present invention may have additional embodiments, and that the invention may be practiced without several of the details described below.

Figure 1:
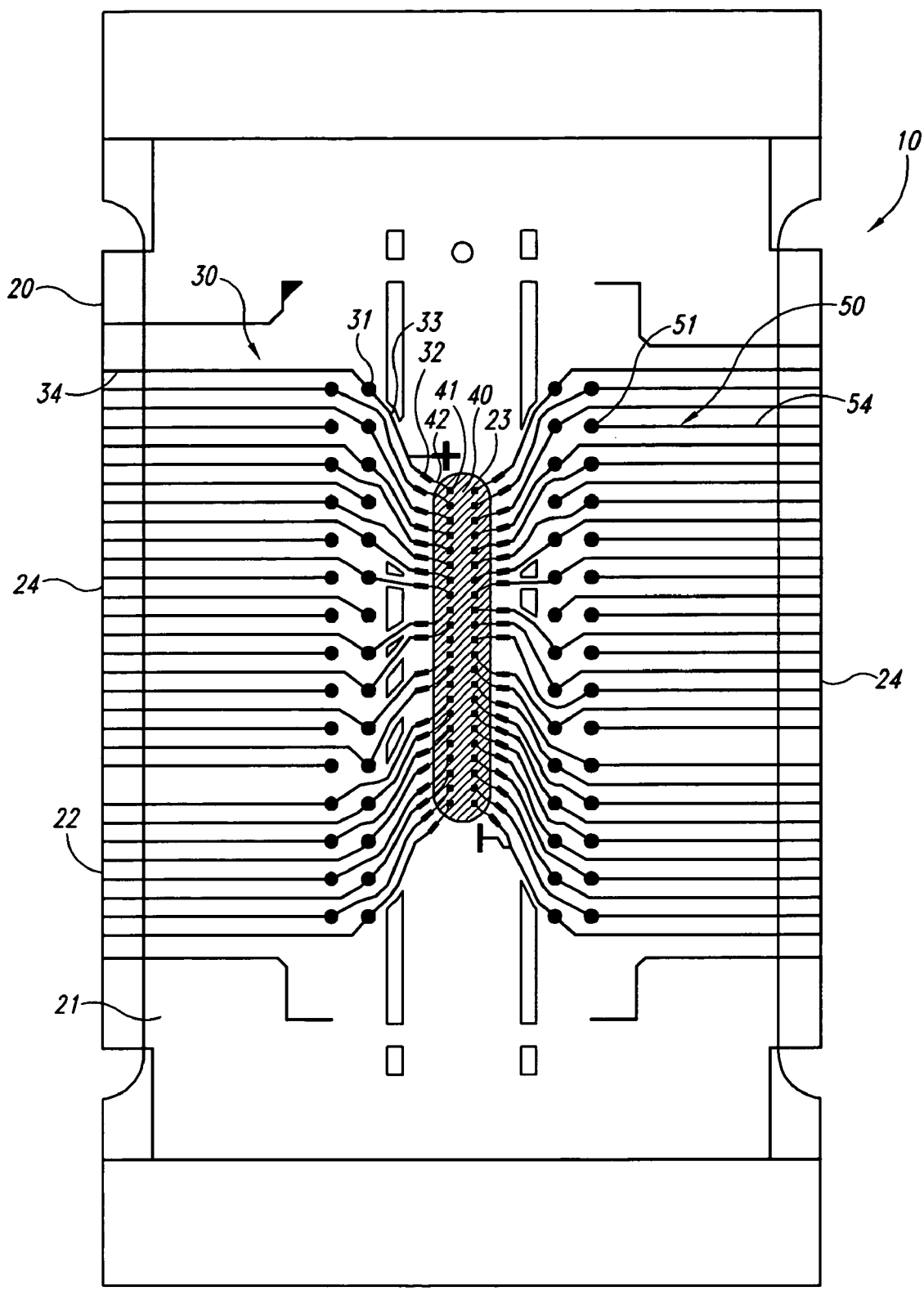
FIG. 1 is a bottom view of a microelectronic device package in accordance with the prior art, with selected features shown schematically.
Figure 2:
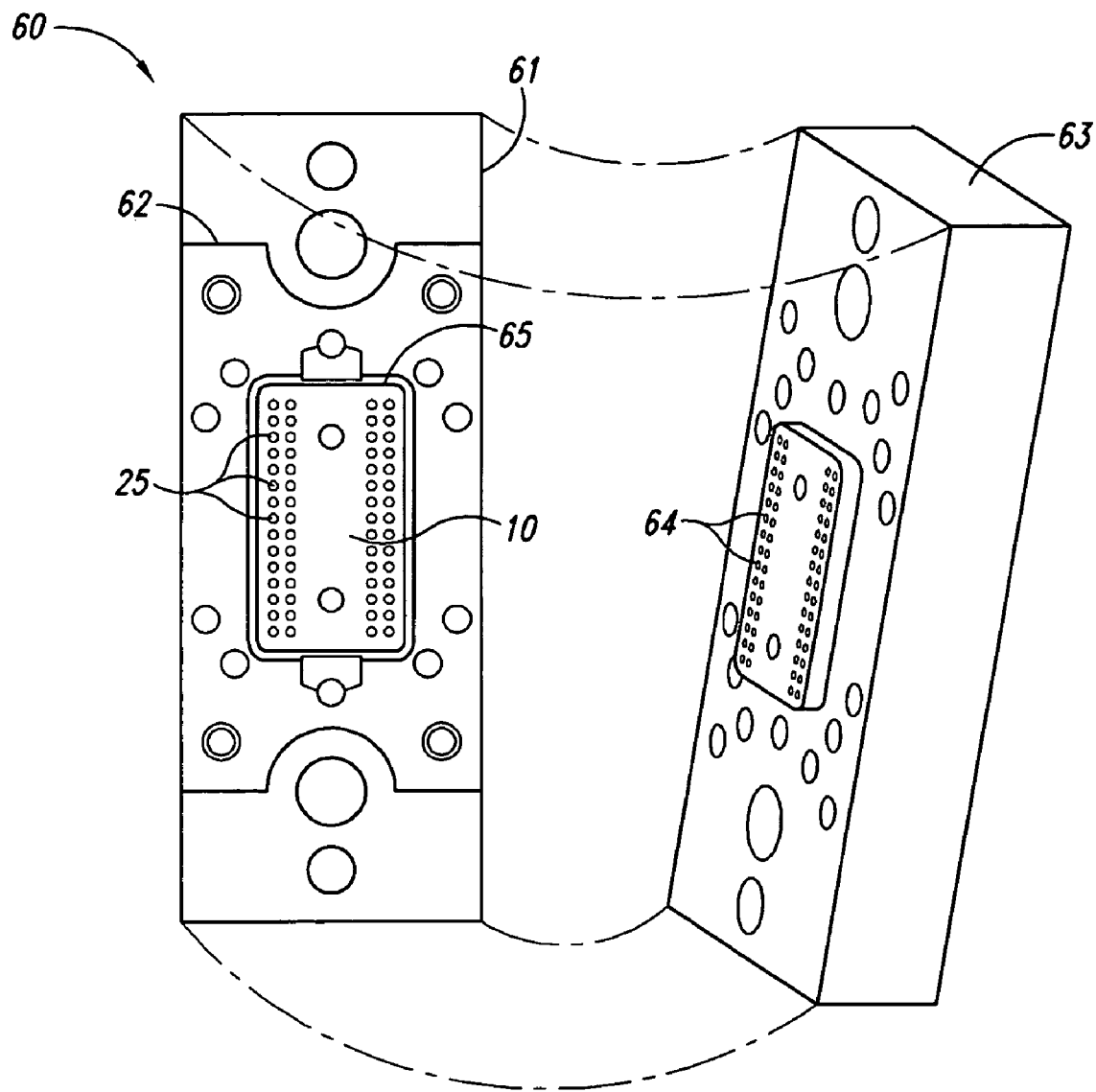
FIG. 2 is a partially exploded illustration of a test apparatus for testing microelectronic device packages in accordance with the prior art.

As described above with reference to FIGS. 1 and 2, a drawback with some conventional arrangements is that the solder balls and/or trace patterns of the packaged device can become dislodged during testing, which typically requires discarding the package. In some cases, it has been observed that the inactive solder balls and traces may become dislodged more frequently than the active solder balls and traces. Accordingly, in several of the embodiments described below, the inactive traces (or connection structures) are more securely attached to the support member, and/or are configured to be symmetric with the active traces (or connection structures). Accordingly, the solder balls or other conductive couplers disposed on the inactive connection structures can have a size, shape and support generally similar to the size, shape and support of the conductive couplers disposed on the active connection structures. As a result, the package can be less likely to be damaged during testing or installation.

Figure 3A:
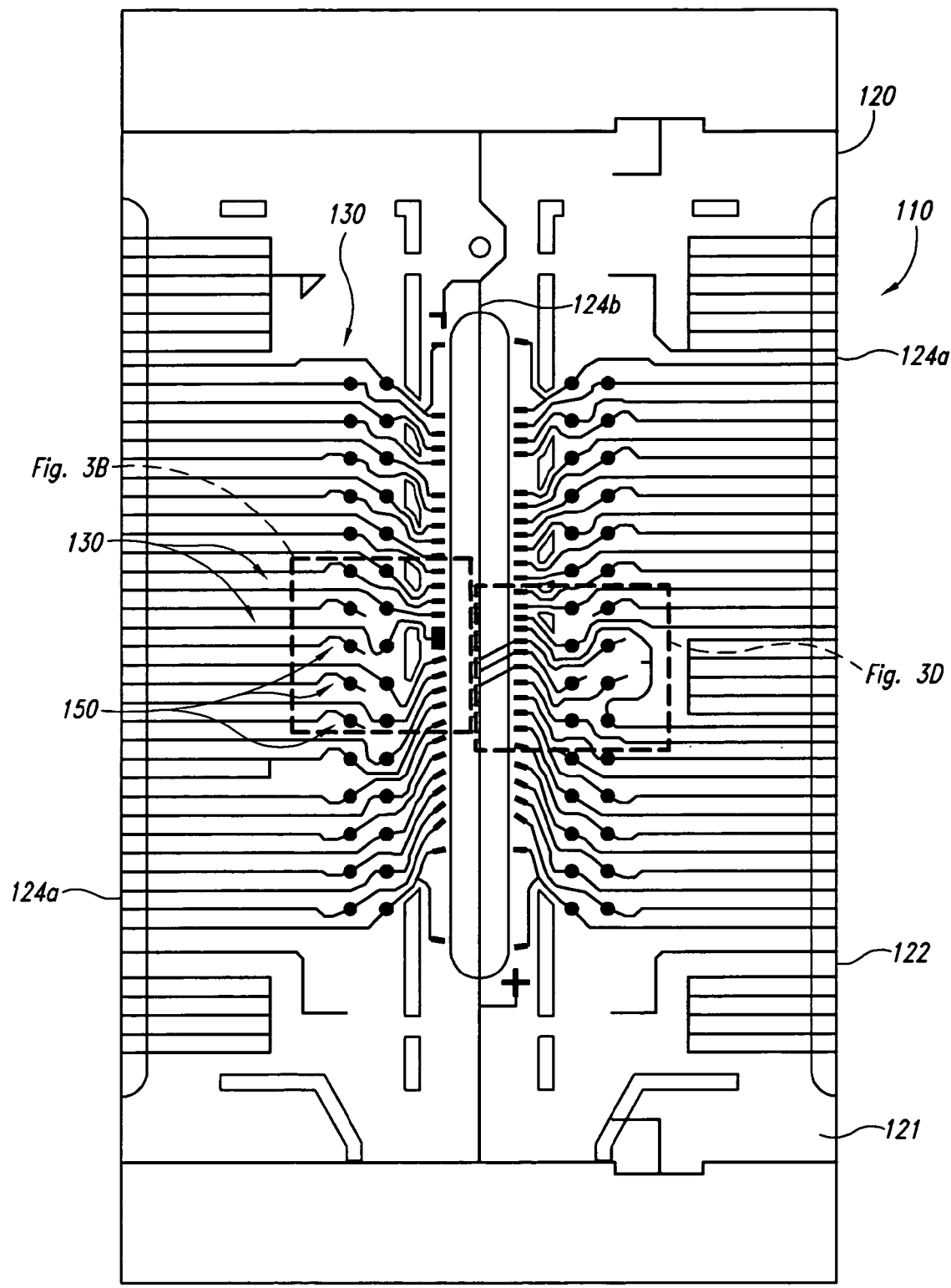
FIG. 3A is a plan view of a support member having active and inactive connection structures in accordance with an embodiment of the invention.

FIG. 3A is a plan view of an apparatus 110 having a support member 120 in accordance with an embodiment of the invention. The support member 120 can have a first surface 121 that supports active connection structures 130 and inactive connection structures 150. The first surface 121 can also include plating buses 124 (shown in FIG. 3A as edge plating buses 124a and a central plating bus 124b) that provide current for plating conductive materials onto the active connection structures 130 and the inactive connection structures 150 as these structures are manufactured. The support member 120 can further include a second surface 122 facing in an opposite direction from the first surface 121 and configured to support a microelectronic substrate for coupling to the active connection structures 130. The support member 120 can include a relatively thin sheet of flexible, epoxy resin, such as BT (bimaleimide triazine) or another suitable material.

Figure 3B:
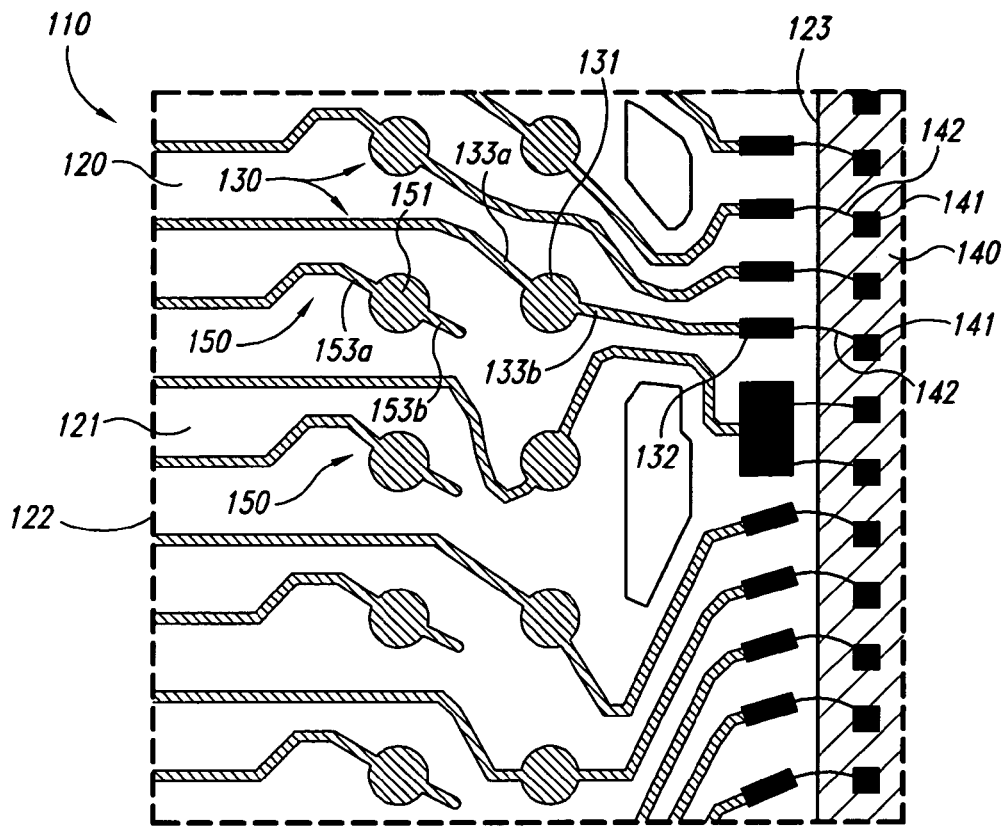
FIG. 3B is an enlarged view of a portion of the support member shown in FIG. 3A, connected to a microelectronic substrate in accordance with an embodiment of the invention.

FIG. 3B is a detailed plan view of a portion of the apparatus 110 described above with reference to FIG. 3A, attached to a microelectronic substrate 140. As shown in FIG. 3B, the central plating bus 124 (FIG. 3A) has been removed to form a slot 123 that extends through the support member 120 from the first surface 121 to the second surface 122. The microelectronic substrate 140 has been mounted to the second surface 122 of the support member 120 such that wire bond pads 141 of the microelectronic substrate 140 are accessible through the slot 123 for connecting to the active connection structures 130 on the first surface 121 of the support member 120.

The active connection structures 130 can each include an active bond site 131, such as a ball bond pad, which is configured to support a volume of a flowable conductive material, such as solder. When the flowable conductive material is disposed on the active bond site 131 and placed in a flowable state (for example, in a solder reflow oven), it can form an at least partially spherical or globular shape suitable for electrically and physically connecting the active connection structure 130 to other devices or circuit elements. The active connection structure 130 can further include two active elongated members 133, shown in FIG. 3B as active elongated members 133a and 133b. The active elongated member 133a extends away from the slot 123 for connecting to the edge plating bus 124a (FIG. 3A). The active elongated member 133b extends between the active bond site 131 and a wire bond pad 132 positioned adjacent to the slot 123. The wire bond pad 132 can be connected with a wire bond 142 to a corresponding one of the wire bond pads 141 of the microelectronic substrate 140 to provide electrical communication between the wire bond pad 141 and the active bond site 131.

The inactive connection structures 150 can each include an inactive bond site 151, such as a ball bond pad, coupled to two inactive elongated members 153, shown in FIG. 3B as inactive elongated members 153a and 153b. Accordingly, the inactive bond site 151 can support a flowable conductive material, such as a solder ball. The inactive elongated member 153a extends away from the slot 123 for connecting to the edge plating bus 124a (FIG. 3A). The inactive elongated member 153b can be shorter than the inactive elongated member 153a to define an elongated tab shape, and can remain electrically decoupled from the microelectronic substrate 140. Accordingly, the inactive bond sites 151 are not electrically connected to the microelectronic substrates 140; however, the solder balls they support (in combination with the solder balls of the active bond sites 131) can form a uniform pattern that is compatible with a variety of electronic devices and test fixtures.

Figure 3C:
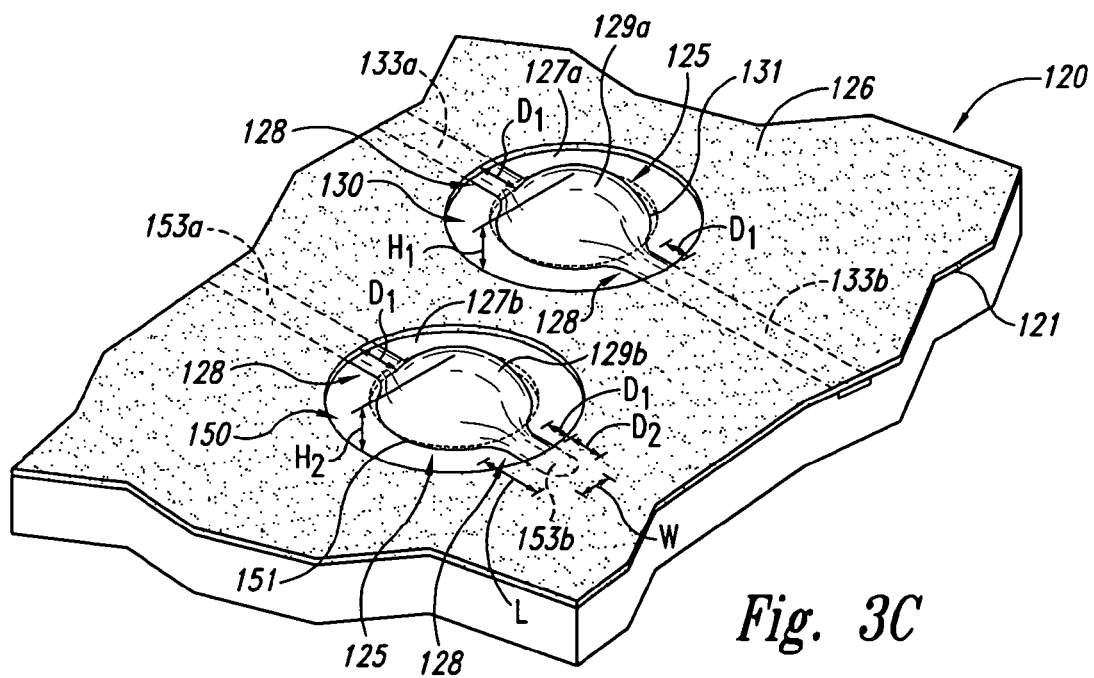
FIG. 3C is an isometric view of portions of active and inactive connection structures, with certain features shown schematically in accordance with an embodiment of the invention.

FIG. 3C is an isometric view of a portion of the support member 120 showing an active connection structure 130 and an inactive connection structure 150, each carrying a quantity of flowable conductive material 125 in accordance with an embodiment of the invention. Accordingly, the flowable conductive material 125 can form conductive couplers 129 (such as solder balls), shown in FIG. 3C as an active conductive coupler 129a supported by the active connection structure 130, and an inactive conductive coupler 129b supported by the inactive connection structure 150. In one aspect of this embodiment, the active elongated members 133a,b and the inactive elongated members 153a,b can include materials that are easily wetted by the flowable conductive material 125. For example, when the flowable conductive material 125 includes solder, the elongated members 153a,b and 133a,b can include nickel, gold, and/or copper or other metallic constituents. Accordingly, when the flowable conductive material 125 is disposed on the bond sites 131 and 151, it tends to wick along the elongated members 133a,b and 153a,b, respectively. When the flowable conductive material 125 solidifies to form the conductive couplers 129, it can have an at least partially elipsoid shape.

In a further aspect of this embodiment, the support member 120 can optionally include a cover layer 126 attached to the first surface 121 with the connection structures 130 and 150 disposed between the cover layer 126 and the first surface 121. In one embodiment, the cover layer 126 can include a solder mask, and in other embodiments, the cover layer 126 can include other materials. In any of these embodiments, the cover layer 126 can have apertures 127 (shown as apertures 127a and 127b) aligned with the bond sites 131 and 151, respectively. The apertures 127 are sized to leave the bond sites 131 and 151 exposed, while covering at least part of each elongated member 133a,b and 153a,b to aid in securing the elongated members to the support member 120. In an alternative embodiment (shown in dashed lines in FIG. 3C) the apertures are sized to leave the bond sites 131 and 151 exposed while covering each elongated member 133a,b and 153a,b up to the edge of the corresponding bond site 131, 151. In other embodiments, the elongated members 133a,b can be secured directly to the first surface 121 without the cover layer 126.

In one embodiment, the bond sites 131 and 150 can each have a diameter of about 330 microns, and each elongated member 133a,b and 153a,b (and in particular, the inactive elongated member 153b) can have a length L of at least 250 microns. The apertures 127a,b in the cover layer 126 can have a diameter of about 430 microns. Accordingly, each bond site 131, 151 can be completely exposed through the corresponding aperture 127a, 127b. A portion 128 of each elongated member 133a,b and 153a,b can also be exposed for a distance $D_1$ of about 50 microns, measured from the edge of the corresponding bond site 131, 151, respectively. The elongated member 153b can be covered by the cover layer 126 for a distance $D_2$ of about 200 microns, and the remaining elongated members can be covered for distances greater than $D_2$. In other embodiments, the foregoing dimensions can have other values.

In a further aspect of this embodiment, each elongated member 153a,b and 133a,b can have approximately the same width W in a direction transverse to the elongation direction to increase the likelihood that the flowable conductive material 125 will wick along each elongated member in at least approximately the same way. In yet a further aspect of this embodiment, the angular spacing between the active elongated members 133a and 133b can be about the same as the angular spacing between the inactive elongated members 131a and 131b (about 180° in FIGS. 3A–C).

One feature of the foregoing arrangement is that the number of inactive elongated members 153 extending away from the inactive bond site 151 is equal to the number of active elongated members 133 extending away from the active bond site 131. Accordingly, the cover layer 126 (or alternatively the elongated members alone) can provide approximately the same securing force to both the inactive connection structure 150 and the active connection structure 130. As a result, the inactive elongated members 153a,b can be less likely to pull away from the support member 120 when subjected to stresses, such as shear stresses which may be imposed on the conductive couplers 129 during testing.

This feature can apply when the cover layer 126 covers some or all of the elongated members, and/or when the cover layer 126 is not implemented. This is unlike some conventional arrangements (such as those described above with reference to FIGS. 1 and 2) for which the inactive connection structure may have fewer elongated members than, the active connection structure and may accordingly be more likely to pull away from the support member when subjected to shear or other stresses.

Another feature of an embodiment of the arrangement described above with reference to FIGS. 3A–C is that the inactive elongated members 153 can wick away the flowable conductive material 125 in generally the same manner and to generally the same extent as the active elongated members 133. For example, because the number of inactive elongated members 153 extending away from each inactive bond site 151 can be the same as the number of active elongated members 133 extending away from each active bond site 131, the flowable conductive material 125 will tend to wick away from both bond sites in generally the same way. Accordingly, approximately the same volume of flowable conductive material will tend to wick along each elongated member and away from each bond site, whether the bond site is active or inactive.

Another feature of an embodiment of the arrangement described above with reference to FIGS. 3A–C is that the angular spacing between adjacent inactive elongated members 153 can be about the same as the angular spacing between adjacent active elongated members 133. As a result, the overall size and shape of flowable conductive material 125 remaining on the inactive bond site 151 (forming the inactive conductive coupler 129b) can be approximately the same as the overall size and shape of the flowable conductive material 125 remaining on the active bond site 131 (forming the active conductive coupler 129a). For example, the height $H_2$ by which the inactive conductive coupler 129b projects from the support member 120 can be at least approximately the same as the height $H_1$ by which the active conductive coupler 129a projects from the support member 120.

Yet another feature of an embodiment of the arrangement describe above with reference to FIGS. 3A–C is that the distance $D_1$ can be at least approximately the same for both the active elongated members 133a,b and the inactive elongated members 153a,b. Accordingly, the flowable conductive material 125 (which tends to wick along the exposed portions of the elongated members, but not beneath the cover layer 126) can wick away from the inactive bond site 151 in generally the same manner and to generally the same extent as it wicks away from the active bond site 131. As a result, the shape of the inactive conductive coupler 129b can be at least approximately identical to the shape of the active conductive coupler 129a.

An advantage of the foregoing features is that the inactive conductive couplers 129b can be contacted by a conventional test fixture (such as the fixture 60 shown in FIG. 2) in generally the same manner as are the active conductive couplers 129a because the shapes and sizes of the conductive couplers 129a,b are about the same. This is unlike some conventional arrangements (such as the arrangement described above with reference to FIG. 1) in which the inactive solder balls may project from the support member by a greater distance than the active solder balls because the solder disposed on the inactive ball bond pads has fewer avenues along which to wick away. In such conventional arrangements, the inactive solder balls may come under greater stress during testing and may be more likely to become dislodged.

Figure 3D:
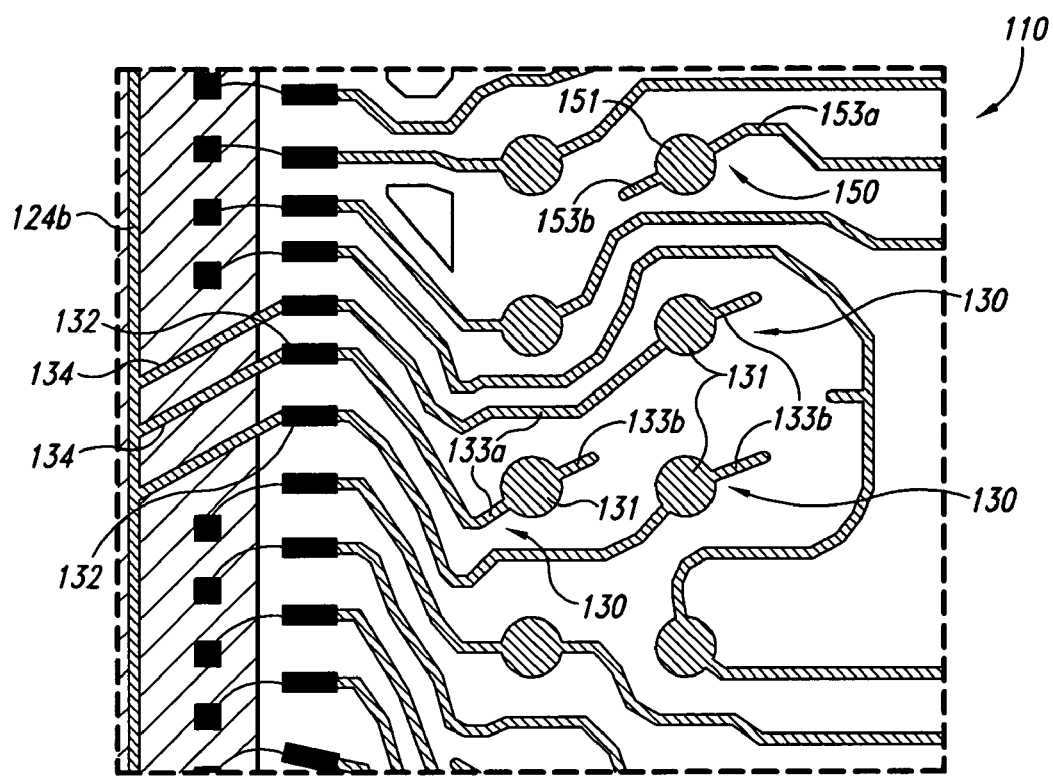
FIG. 3D is an enlarged plan view of another portion of the support member shown in FIG. 3A, connected to a microelectronic substrate in accordance with an embodiment of the invention.

FIG. 3D is an enlarged plan view of another portion of the apparatus 110 described above with reference to FIG. 3A. Three of the active connection structures 130 shown in FIG. 3D have an electroplating trace 134 connected between the central plating bus 124b and the corresponding wire bond pad 132. These active connection structures 130 also have an active elongated member 133a extending between the wire bond pad 132 and the corresponding bond site 131. These active connection structures 130 can further include an active elongated member 133b having an elongated tab shape generally similar to that of the inactive elongated members 153b described above. Accordingly, the active connection structures 130 and the inactive connection structure 150 shown in FIG. 3D can each have the same number of elongated members extending from the corresponding bond sites, and can accordingly carry conductive couplers (not shown in FIG. 3D) having at least approximately similar shapes in a manner generally similar to that described above with reference to FIGS. 3A–C.

Figure 4:
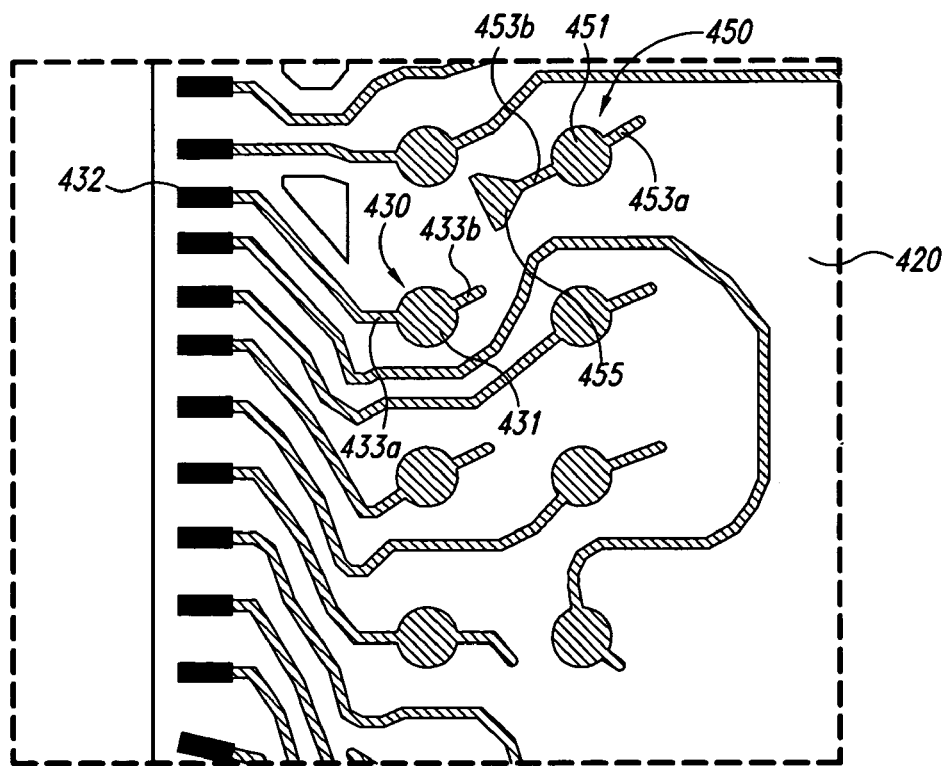
FIG. 4 is an enlarged plan view of a portion of a support member in accordance with another embodiment of the invention.

FIGS. 4–8 illustrate support members with connection structures having arrangements in accordance with further embodiments of the invention. For example, FIG. 4 illustrates a support member 420 having an active connection structure 430 and an inactive connection structure 450, neither of which includes an electroplating trace. Accordingly, the support member 420 can be processed electrolessly to plate the connection structures 430 and 450 during manufacturing. The active connection structure 430 can include an active bond site 431 having an active elongated member 433a connected to a corresponding wire bond pad 432 in a manner generally similar to that described above. The active connection structure 430 can also include a tab-shaped active elongated member 433b extending away from the active bond site 431.

The inactive connection structure 450 can include an inactive bond site 451 and two inactive elongated members 453a and 453b. In a further aspect of this embodiment, the inactive elongated member 453b can include an anchor 455 which can increase the strength of the connection between the inactive connection structure 450 and the support member 420. For example, the anchor 455 can provide more surface area beneath the corresponding cover layer 126 (not shown in FIG. 4), which can further reduce the likelihood for tearing the inactive connection structure 450 away from the support member 420 when the inactive connection structure 450 is subjected to a shear stress. In one embodiment, the anchor 455 can have a generally triangular shape, and in other embodiments, the anchor 455 can have other shapes. In still further embodiments, the anchor 455 can be included as part of any of the elongated members described above or below, when space permits.

Figure 5:
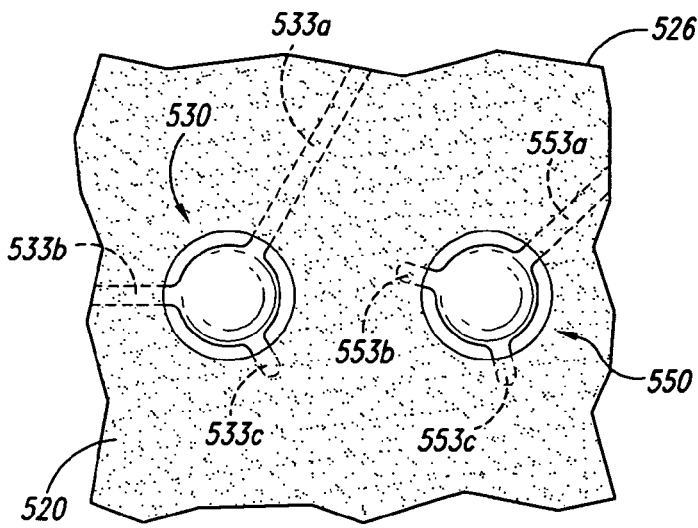
FIG. 5 is a plan view of a portion of a support member having active and inactive connection structures configured for electroplating in accordance with another embodiment of the invention.

FIG. 5 illustrates an embodiment of a support member 520 having an active connection structure 530 with three active elongated members 533a, 533b and 533c. The support member 520 can further include an inactive connection structure 550 having three inactive elongated members 553a, 553b and 553c. The elongated members 533a and 553a can be coupled to an edge plating bus (not shown in FIG. 5), and the elongated member 533b can be coupled to a wire bond pad (not shown in FIG. 5) in a manner generally similar to that described above. The elongated members 533a, 533b and 553a, as well as the elongated members 533c, 553b and 553c (which are not connected to other conductive structures) can extend beneath a cover layer 526 to secure the connection structures to the support member 520, as was generally discussed above. Alternatively, the cover layer 526 can be eliminated and the elongated members can be secured to the support member 520 with other techniques. In either embodiment, the active connection structure 530 and the inactive connection structure 550 can each include the same number of elongated members and can accordingly support conductive couplers having at least approximately similar shapes and sizes. In a further aspect of this embodiment, each elongated member can be angularly spaced apart from its neighbor by about 120°. In other embodiments, the angular spacing can have other values for which the angular spacings for the active elongated members 533*a–c* are at least generally similar to those for the inactive elongated members 553*a–c*.

Figure 6:
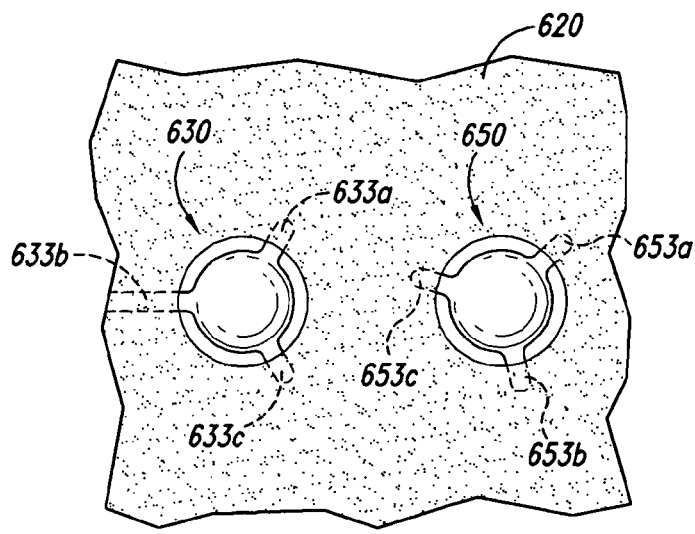
FIG. 6 is a plan view of a portion of a support member having active and inactive connection structures configured for electroless plating in accordance with another embodiment of the invention.

FIG. 6 illustrates a support member 620 having an active connection structures 630 and an inactive connection structures 650. These connection structures are generally similar to the connection structures described above except that the connection structures 630 and 650 are configured for electroless plating. Accordingly, the active connection structure 630 can include an active elongated member 633*b* coupled to a wire bond pad (not shown in FIG. 6), and can also include two tab-shaped elongated members 633*a* and 633*c* that are not connected to other conductive structures. All three inactive elongated members 653*a–c* can be unconnected to other conductive structures.

Figure 7:
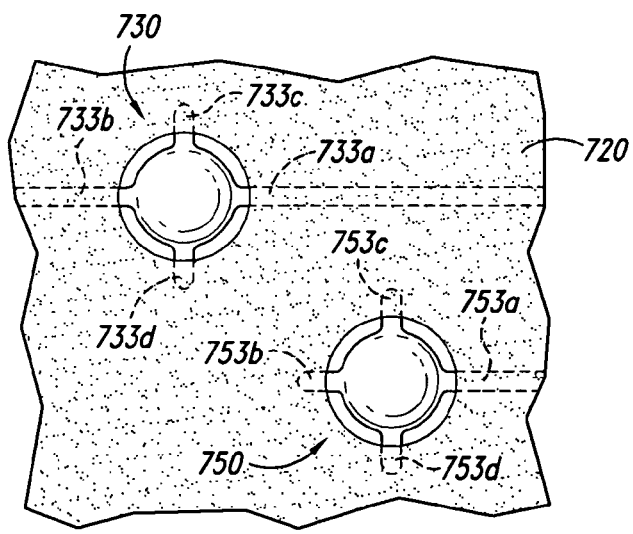
FIG. 7 is a plan view of a portion of a support member having active and inactive connection structures configured for electroplating in accordance with yet another embodiment of the invention.

FIG. 7 illustrates a support member 720 having an active connection structure 730 with four active elongated members 733*a–d*, and an inactive connection structure 750 having four inactive elongated members 753*a–d*. The elongated members 733*a* and 753*a* are each configured to be coupled to a plating bus in a manner generally similar to that described above with reference to FIGS. 3B and 5. In one aspect of this embodiment, each elongated member is angularly spaced apart from its neighbor by about 90°. In other embodiments, the angular spacing can have other values with the angular spacing between adjacent active elongated members 733*a–d* being approximately the same as the angular spacing between inactive elongated members 753*a–d*, and the number of active elongated members 733 being the same as the number of inactive elongated members.

Figure 8:
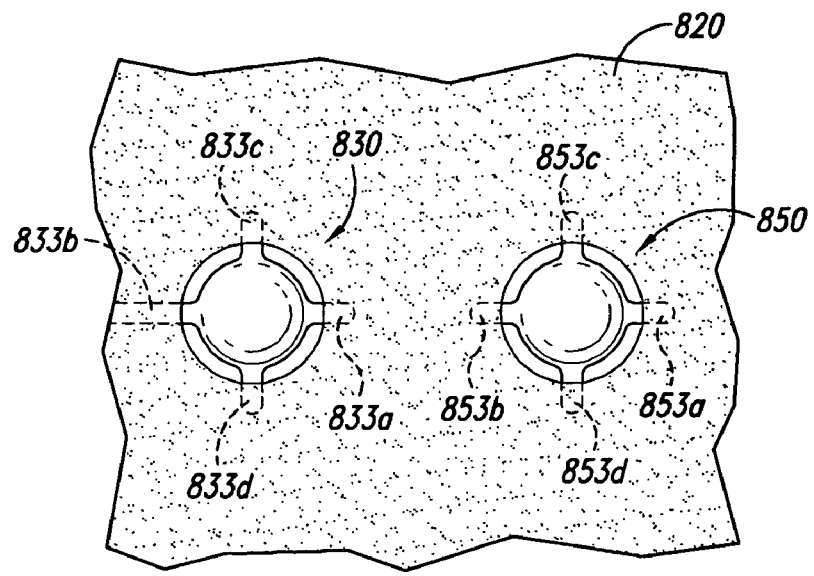
FIG. 8 is a plan view of a portion of a support member having active and inactive connection structures configured for electroless plating in accordance with still another embodiment of the invention.

FIG. 8 illustrates a support member 820 having an active connection structure 830 and an inactive connection structure 850, each configured for electroless plating. Accordingly, the active connection structure 830 can have four active elongated members 833*a–d*. The inactive connection structure 850 can have four inactive elongated members 853*a–d*. As described above, the number of and spacing between active elongated members 833*a–d* can be at least approximately the same as for the inactive elongated members 853*a–d*.

In other embodiments, the active and inactive connection structures can have other shapes and arrangements for which the number of elongated members extending outwardly from an active bond site is equal to the number of elongated members extending outwardly from an inactive bond site. In any of these arrangements, the connection structures and, optionally, the corresponding cover layers, can support conductive couplers (such as solder balls) having generally similar shapes and similar behaviors, regardless of whether the conductive couplers are carried by an active bond site or an inactive bond site.

Figure 9:
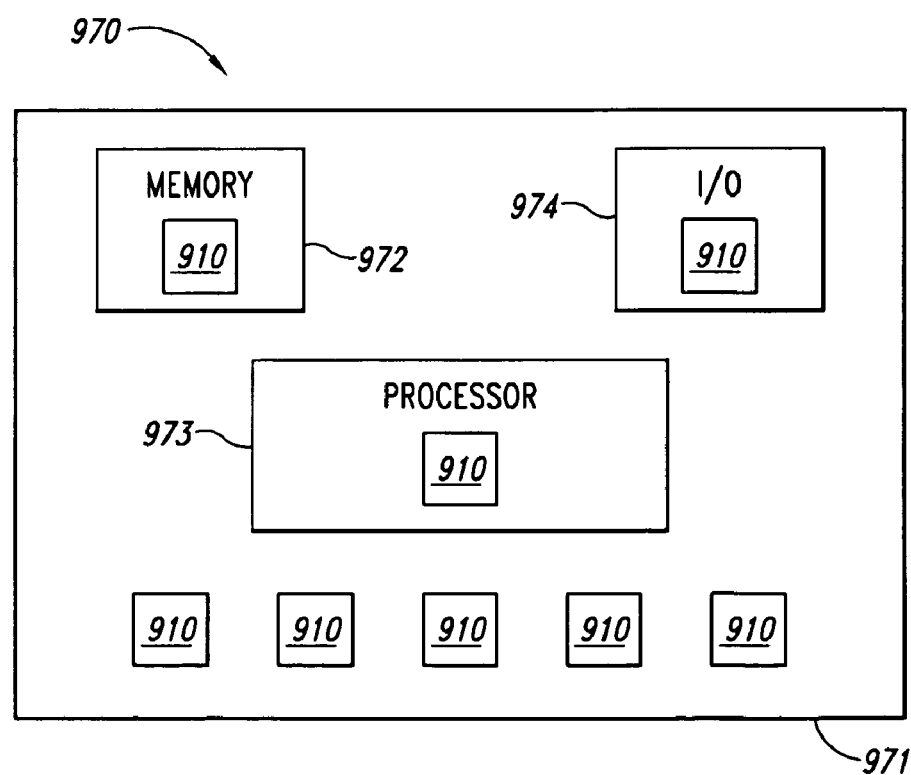
FIG. 9 is a schematic illustration of a device that includes apparatuses in accordance with another aspect of the invention.

FIG. 9 is a schematic illustration of an electronic device 970 that includes one or more apparatuses 910 in accordance with an embodiment of the invention. In one aspect of this embodiment, the electronic device can include a computer, a telecommunication device or another device that incorporates microelectronic components. Accordingly, the device 910 can include a housing 971 containing a processor 973, a memory 972 and/or an input/output device 974, each of which can include an apparatus 910 generally similar to any of the apparatuses described above with reference to FIGS. 3A–8. The device 910 can also include other apparatuses 910 in addition to or in lieu of the apparatuses incorporated into the processor 973, the memory 972 and/or the input/output device 974.

Figure 10:
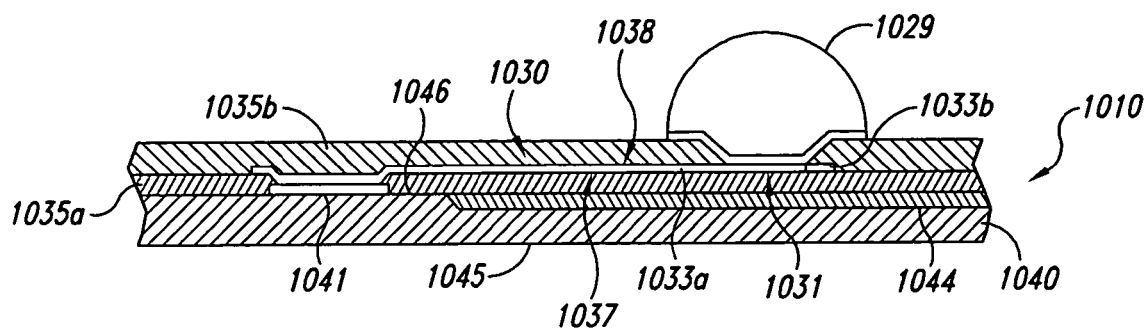
FIG. 10 is a cross-sectional side view of an apparatus including a microelectronic substrate and a connection structure in accordance with another embodiment of the invention.

FIG. 10 is a cross-sectional side view of an apparatus 1010 that includes a microelectronic substrate 1040 having a connection structure 1030 disposed on it in accordance with another embodiment of the invention. In one aspect of this embodiment, the microelectronic substrate 1040 can have a first surface 1045 and a second surface 1046 facing opposite from the first surface 1045. The microelectronic substrate 1040 can further include active microelectronic features 1044 positioned proximate to the second surface 1046, and a first bond site 1041 (such as a bond pad), also positioned proximate to the second surface 1046.

The connection structure 1030 can include a second bond site 1031 spaced apart from the first bond site 1041. The second bond site 1031 can include a solder ball pad, and can support a conductive coupler 1029, such as a solder ball. Accordingly, the appuratus 1010 can have a "flip chip" configuration. In other embodiments, the second bond site 1031 can have other configurations and can support other types of conductive couplers. In any of these embodiments, the connection structure 1030 can include an electrically conductive material (such as a metal redistribution layer) and can have a first surface 1037 facing toward the second surface 1046 of the microelectronic substrate 1040, and a second surface 1038 facing opposite from the first surface 1037. The connection structure 1030 can further include elongated members 1033*a* and 1033*b* extending outwardly from the second bond site 1031. In one aspect of this embodiment, the elongated member 1033*a* can be connected between the second bond site 1031 of the connection structure and the first bond site 1041 of the microelectronic substrate 1040. The elongated member 1033*b* can have a generally tab-shaped configuration, generally similar to those described above.

In a further aspect of this embodiment, the apparatus 1010 can include passivation layers 1035 (shown as a first passivation layer 1035*a* and a second passivation layer 1035*b*) positioned between electrically conductive elements of the apparatus 1010 to at least partially isolate these elements from each other. For example, the first passivation layer 1035*a* can be positioned between the second surface 1046 (including the active microelectronic features 1044) of the microelectronic substrate 1040, and the first surface 1037 of the connection structure 1030. The second passivation layer 1035*b* can be positioned adjacent to the second surface 1038 of the connection structure 1030. In one aspect of this embodiment, the second passivation layer 1035*b* can perform at least some of the same functions as the cover layer 126 described above reference to FIG. 3C. Accordingly, the second passivation layer 1035*b* can aid in securing the connection structure 1030 to the microelectronic substrate 1044. In one embodiment, the second passivation layer 1035*b* can extend over the entire lengths of the elongated members 1033*a*, 1033*b*, while leaving the second connection site 1031 exposed to receive the conductive coupler 1029. Alternatively, the second passivation layer 1035*b* can leave portions of the elongated members 1033*a*, 1033*b* proximate to the second bond site 1031 exposed to allow the conductive coupler 1029 to wick along the elongated members 1033a, 1033b, generally as was described above with reference to FIG. 3C.

Figure 11:
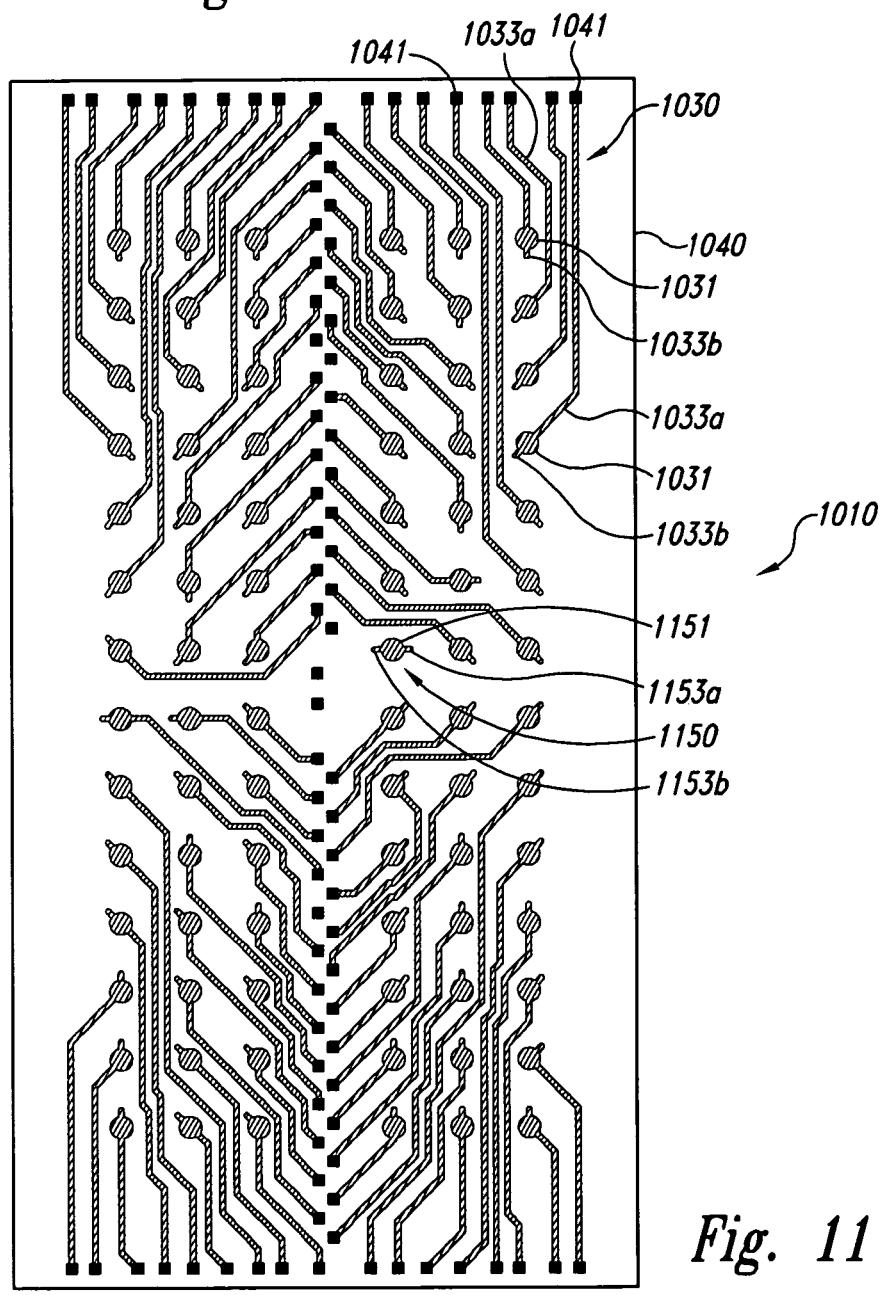
FIG. 11 is a plan view of the apparatus shown in FIG. 10 in accordance with an embodiment of the invention.

FIG. 11 is a plan view of an embodiment of the apparatus 1010 described above with reference to FIG. 10. In one aspect of this embodiment, each of the elongated members 1033a can extend between the corresponding first bond site 1041 of the microelectronic substrate 1040 and the corresponding second bond site 1031, and can be generally co-planer with each other. In an alternative embodiment, the elongated members 1033a can cross over each other, for example, by extending into different planes normal to the plane of FIG. 11 to avoid electrical contact with the elongated members over which they pass.

In a further aspect of this embodiment, the apparatus 1010 can include an inactive connection structure 1150 having a second bond site 1151. Elongated members 1153a, 1153b can extend outwardly from the second bond site 1151, without being electrically connected to the microelectronic substrate 1040. Accordingly, the inactive connection structures 1150 can support a conductive coupler to provide uniformity with a pre-selected pattern of conductive couplers, in a manner generally similar to that described above.

Figure 12A:
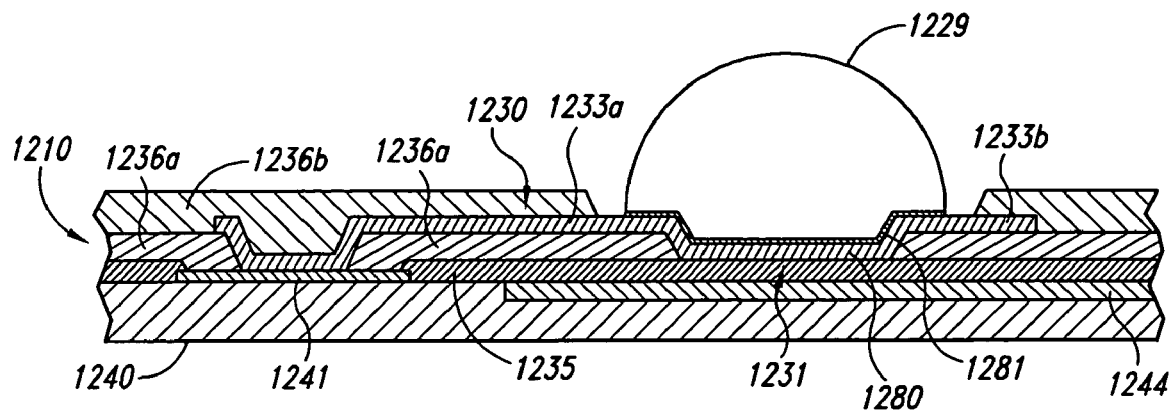
FIG. 12A is a cross-sectional side view of an apparatus including a microelectronic substrate and a connection structure having elongated members in accordance with yet another embodiment of the invention.
Figure 12B:
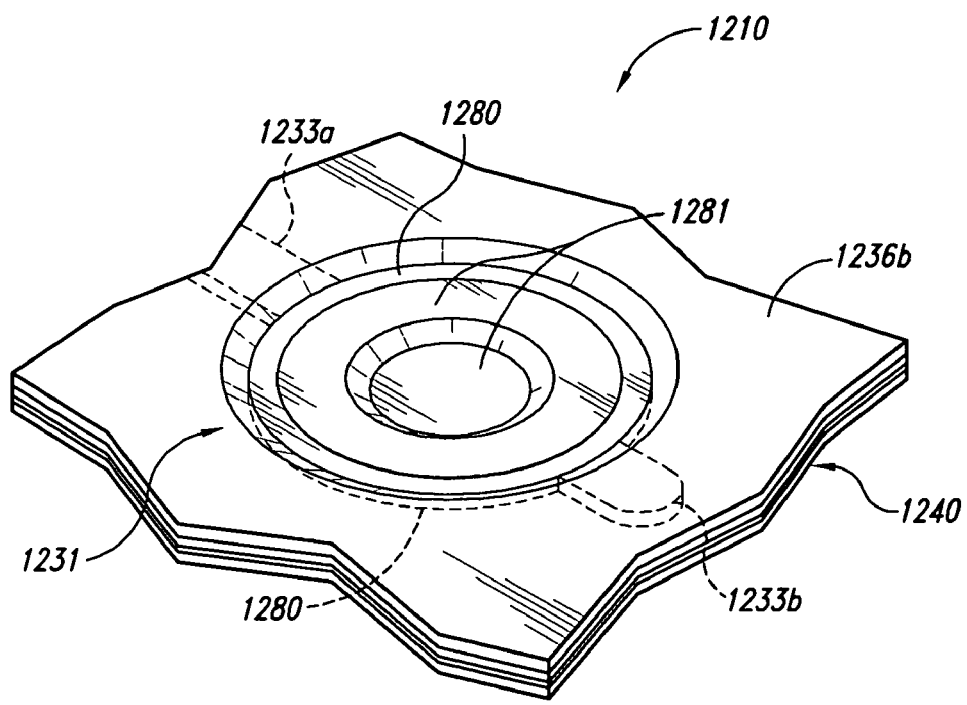
FIG. 12B is a top isometric view of a portion of the apparatus shown in FIG. 12A.

FIGS. 12A–B illustrate a cross-sectional side view and top isometric view, respectively, of an apparatus 1210 in accordance with another embodiment of the invention. In one aspect of this embodiment, the apparatus 1210 can include a microelectronic substrate 1240 having a first bond site 1241, and a connection structure 1230 having a second bond site 1231. The microelectronic substrate 1240 can include active devices 1244 electrically coupled to the first bond site 1241. The connection structure 1230 can include a plurality of elongated members 1233 (two are shown in FIGS. 12A–B as elongated members 1233a, 1233b) extending outwardly from the second bond site 1231. In one aspect of this embodiment, the elongated member 1233a can be coupled between the first bond site 1241 and the second bond site 1231, and the elongated member 1233b can include an elongated tab-shaped member generally similar to those described above. The bond site 1231 can include a support portion 1280 carrying a wettable portion 1281. The support portion 1280 can have a composition generally similar to that of the elongated members 1233a–1233b (for example, a composite of aluminum, nickel, copper and titanium), and the wettable portion 1281 can have a different composition (such as a composite of nickel and copper). Accordingly, the wettable portion 1281 can be configured to be wetted by a flowable conductive material (such as solder) to support and electrically couple to a conductive coupler 1229.

In a further aspect of this embodiment, the apparatus 1210 can include a die passivation layer 1235 positioned between the active devices 1244 and the connection structure 1230. A first dielectric layer 1236a can be disposed between the passivation layer 1235 and the elongated members 1233a, 1233b, and a second dielectric layer 1236b can be disposed on top of the connection structure 1230. In one aspect of an embodiment shown in FIGS. 12A and B, the elongated members 1233a, 1233b are not wetted by the conductive coupler 1229 because the wettable portion 1281 of the second bond site 1231 does not extend over the elongated members. In an alternate embodiment, the elongated members 1233a, 1233b can be wetted by the conductive coupler 1229 in a manner generally similar to that described above with reference to FIG. 3C.

Figure 13A:
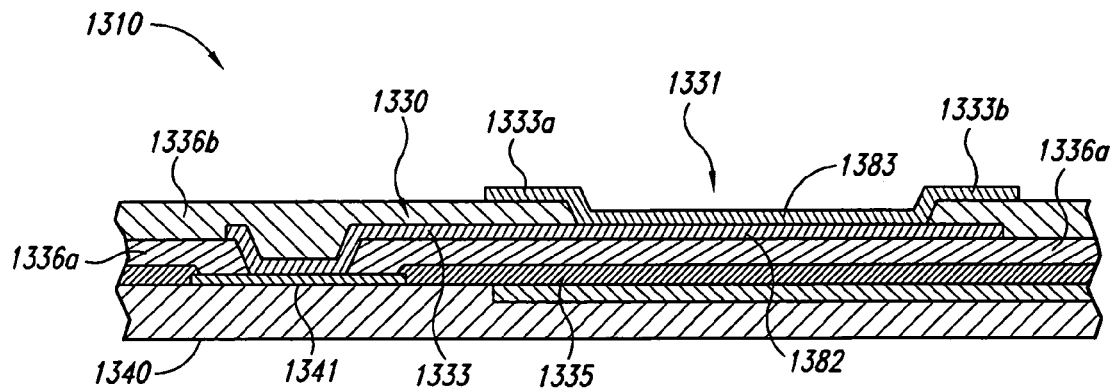
FIG. 13A is a cross-sectional side view of an apparatus including a microelectronic substrate and a connection structure in accordance with still another embodiment of the invention.
Figure 13B:
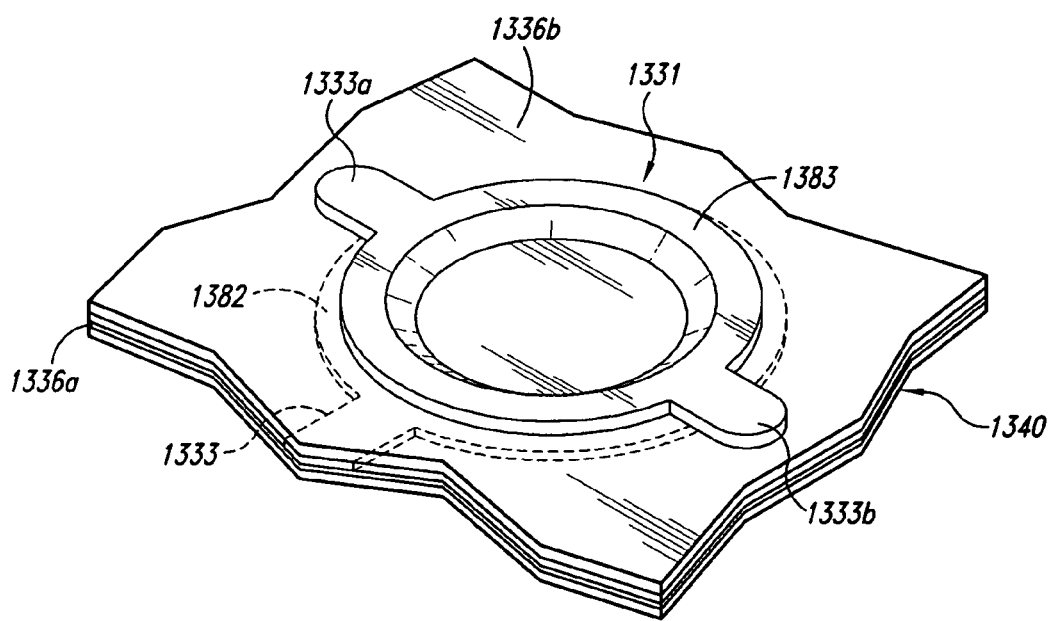
FIG. 13B is a top isometric view of a portion of the apparatus shown in FIG. 13A.

FIG. 13A is a cross-sectional side view of an apparatus 1310 having a connection structure 1330 in accordance with another embodiment of the invention. FIG. 13B is a top isometric view of a portion of the apparatus 1310 shown in FIG. 13A. Referring first to FIG. 13A, the apparatus 1310 can include a microelectronic substrate 1340 having a first bond site 1341, a passivation layer 1335, and a first dielectric layer 1336a disposed on the passivation layer 1335. The connection structure 1330 can be disposed on the first dielectric layer 1336a and can include a second bond site 1331 electrically connected to the first bond site 1341 with a connecting trace 1333.

Referring now to FIGS. 13A and 13B, the second bond site 1331 can include a generally circular first portion 1382 positioned on the first dielectric layer 1336a and electrically connected to the connecting trace 1333. A second dielectric layer 1336b can be disposed on the connection structure 1330, including the first portion 1382 of the second bond site 1331. The second bond site 1331 can further include a second portion 1383 electrically connected to the first portion 1382 and having at least two elongated members 1333a, 1333b extending outwardly therefrom over the second dielectric layer 1336b. In one aspect of this embodiment, the first portion 1382 can include a composite of titanium and either copper or aluminum, and the second portion 1383 can include a composite of titanium, copper, and nickel. In other embodiments, these components can include other constituents. In any of these embodiments, the elongated member 1333a, 1333b can provide some or all of the advantages described above with reference to the foregoing figures.

Figure 14:
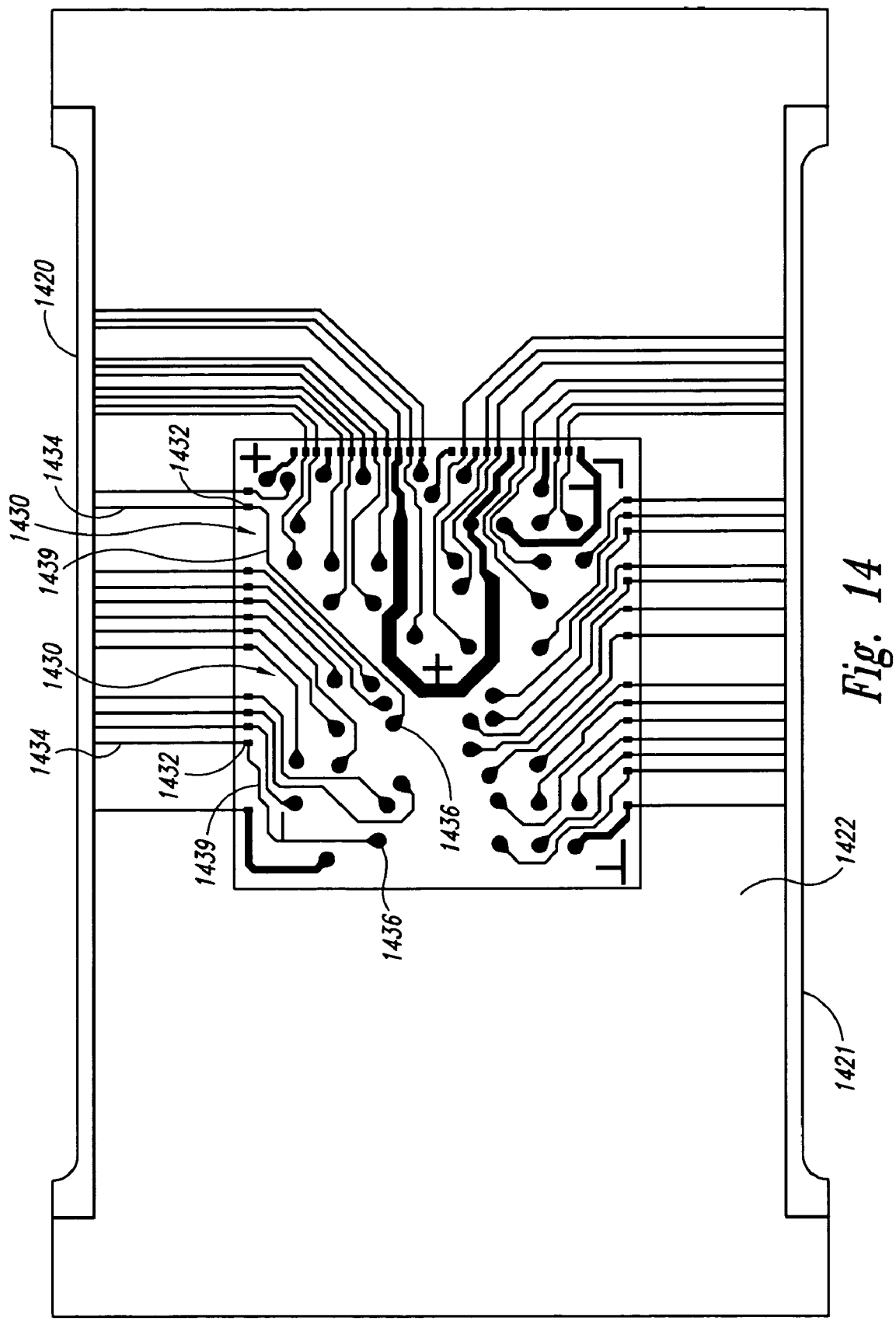
FIG. 14 is a top plan view of a support member in accordance with another embodiment of the invention.

FIG. 14 illustrates a top plan view of a support member 1420 for supporting a microelectronic substrate in accordance with another embodiment of the invention. In one aspect of this embodiment, the support member 1420 can include a first surface 1421 and a second surface 1422 facing opposite from the first surface 1421. The second surface 1422 can be configured to carry a microelectronic substrate. The support member 1420 can include connection structures 1430 for connecting the microelectronic substrate supported on the support member 1420 to other electronic or microelectronic devices. In one aspect of this embodiment, each connection structure 1430 can include a first bond site (such as a solder pad) described below with reference to FIG. 15, and a second bond site 1432, such as a wire bond pad, configured to be electrically coupled to corresponding terminals of the microelectronic substrate. The connection structure 1430 can further include electroplating traces 1434 configured to connect to a source of electrical potential for plating the connection structure 1430, generally in a manner similar to that described above. Alternatively, the connection structures 1430 can be plated with an electroless process.

The connection structures 1430 can further include a connecting trace 1439 that extends outwardly from the second bond site 1432. The connecting trace 1439 can be coupled to a via 1436 that extends from the second surface 1422 of the support member 1420 to the first surface 1421. The via 1436 can be electrically coupled to the first bond site of the support member 1420, as described in greater detail below with reference to FIG. 15.

FIG. 15 is a bottom plan view of an embodiment of the support member 1420 described above with reference to FIG. 14. As shown in FIG. 15, each of the vias 1436 of the connection structures 1430 can extend through the support member 1420 to the first surface 1421. Each via 1436 can be electrically connected to a corresponding first bond site 1431 (such as a solder ball pad), to provide for electrical communication between the first bond site 1431 and the second bond site 1432 (FIG. 14) on the opposite side of the support member. Accordingly, each connection structure 1430 can include at least two elongated members 1433*a*, 1433*b* extending outwardly from the first bond site 1431. The elongated member 1433*b* can extend between the first bond site 1431 and the via 1436 to provide for electrical communication between these two components of the connection structure 1430. The elongated member 1433*a* can include a generally tab-shaped structure generally similar to those described above. Accordingly, the elongated members 1433*a*, 1433*b* can provide some or all of the functions and advantages described above with reference to FIGS. 3A–8. For example, in one aspect of this embodiment, the elongated members 1433*a*, 1433*b* can aid in securing the first bond site 1431 to the first surface 1421 of the support member 1420. The support member 1420 can include a cover layer generally similar to that described above with reference to FIG. 3C to aid in attaching the connection structure 1430 to the first surface 1421. Accordingly, the cover layer can be configured to either allow or prevent wicking of a flowable conductive material along the elongated members 1433*a*, 1433*b*.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method for coupling a flowable conductive material to a microelectronic device, comprising:
   aligning a support member to receive the flowable conductive material, the support member having a support surface configured to carry a microelectronic substrate, the support member further having a first connection structure and a second connection structure, the first connection structure being configured to remain decoupled from a microelectronic substrate when the support member carries the microelectronic substrate, the first connection structure having a first bond site configured to receive the flowable conductive material, the second connection structure having a second bond site configured to receive the flowable conductive material, the second connection structure being configured to be electrically coupled to the microelectronic substrate when the support member carries the microelectronic substrate;
   disposing a first quantity of the flowable conductive material on the first bond site;
   wicking a first portion of the first quantity of flowable conductive material along first elongated members connected to and extending outwardly from the first bond site;
   disposing a second quantity of the flowable conductive material on the second bond site; and
   wicking a second portion of the second quantity of flowable conductive material along second elongated members extending outwardly from the second bond site, with the second portion of the flowable conductive material having a volume approximately equal to a volume of the first portion.

2. The method of claim 1 wherein wicking the first portion includes wicking the first portion along a first number of first elongated members, and wherein wicking the second portion includes wicking the second portion along a second number of second elongated members, with the first number equal to the second number.

3. The method of claim 1, further comprising:
   attaching a microelectronic substrate to the support member;
   electrically coupling the microelectronic substrate to the second connection structure; and
   testing the microelectronic substrate by contacting a test fixture with the flowable conductive material on the first and second connection structures.

4. The method of claim 1, further comprising selecting the second connection structure to include a third bond site configured to be wire bonded to the microelectronic substrate when the microelectronic substrate is carried by the support member, and wherein and at least one of the second elongated members extends between the second and third bond sites.

5. The method of claim 1 wherein wicking the first portion of flowable conductive material includes wicking the first portion along two first elongated members extending away from opposite sides of the first bond site.

6. The method of claim 1, further comprising:
   disposing a layer on the support member and on the first and second elongated members; and
   aligning a first aperture of the layer with the first bond site and aligning a second aperture of the layer with the second bond site.

7. The method of claim 1, further comprising disposing a layer on the support member and over the first and second elongated members with a first aperture of the layer aligned with the first bond site and a second aperture of the layer aligned with the second bond site, further wherein a covered portion of each first and second elongated member extends between the layer and the support member, and an exposed portion of each elongated member is exposed through one of the first and second apertures, still further wherein each exposed portion has approximately the same length.

8. The method of claim 1 wherein the first bond site includes a solder pad having a diameter of about 330 microns and wherein at least one of the first elongated members has a length of about 250 microns, and wherein the method further comprises disposing a solder mask over the first and second elongated members with a first aperture of the solder mask aligned with the first bond site and a second aperture aligned with the second bond site, and with a covered portion of the at least one first elongated member extending beneath the solder mask for a distance of about 200 microns.

9. The method of claim 1, further comprising selecting the first connection structure to include at least one electrically conductive metallic material.

10. The method of claim 1, further comprising selecting one of the first elongated members to be shorter than another of the elongated members.

11. The method of claim 1, further comprising:
   temporarily coupling at least one of the first elongated members to a plating bus;
   applying electrical current to the plating bus to plate the first connection structure; and
   decoupling the first elongated members from the plating bus.

12. The method of claim 1, further comprising:
   attaching a microelectronic substrate to the support member; and
   electrically coupling the microelectronic substrate to the second connection structure.

13. The method of claim 1, further comprising selecting the first connection structure to have two elongated members.

14. The method of claim 1, further comprising selecting the first connection structure to have three elongated members.

15. The method of claim 1, further comprising anchoring an end of at least one of the elongated members to the support member.

16. The method of claim 1, wherein each of the first and second elongated members has an axis along which the member is elongated and wherein the method further includes selecting each elongated member to have an approximately equal width transverse to the axis.

17. The method of claim 1, further comprising:
attaching a microelectronic substrate to the support surface of the support member; and
connecting the microelectronic substrate to the second connection structure by passing a wire from the microelectronic substrate through an aperture in the support surface and to the second connection structure.

18. The method of claim 1 wherein disposing the first quantity of flowable conductive material includes forming a first solder ball projecting away from the first bond site by a first distance, and wherein disposing the second quantity of flowable conductive material includes forming a second solder ball projecting away from the second bond site by a second distance at least approximately equal to the first distance.

19. A method for coupling a flowable conductive material to a microelectronic device, comprising:
aligning a support member to receive a flowable conductive material, the support member having a support surface configured to carry a microelectronic substrate, the support member further having a first connection structure and a second connection structure, the first connection structure being configured to remain decoupled from a microelectronic substrate when the support member carries the microelectronic substrate, the first connection structure having a first bond site configured to receive the flowable conductive material, the second connection structure having a second bond site configured to receive the flowable conductive material and be electrically coupled to the microelectronic substrate when the support member carries the microelectronic substrate;
disposing a first quantity of the flowable conductive material on the first bond site to form a first conductive coupler;
wicking a first portion of the first quantity of flowable conductive material along first elongated members connected to and extending outwardly from the first bond site such that the first conductive coupler projects away from the first bond site in an at least approximately normal direction by a first distance;
disposing a second quantity of the flowable conductive material on the second bond site to form a second conductive coupler; and
wicking a second portion of the second quantity of flowable conductive material along second elongated members extending outwardly from the second bond site such that the second conductive coupler projects away from the second bond site in an at least approximately normal direction by a second distance at least approximately equal to the first distance.

20. The method of claim 19 wherein wicking the second portion includes wicking a second portion having a volume at least approximately equal to a volume of the first portion.

21. The method of claim 19 wherein wicking the first portion includes wicking the first portion along a first number of first elongated members, and wherein wicking the second portion includes wicking the second portion along a second number of second elongated members, with the first number equal to the second number.

22. The method of claim 19 wherein wicking the first portion of flowable conductive material includes wicking the first portion along two first elongated members extending away from opposite sides of the first bond site.

23. The method of claim 19, further comprising disposing a layer on the support member and over the first and second elongated members with a first aperture of the layer aligned with the first bond site and a second aperture of the layer aligned with the second bond site, further wherein a covered portion of each first and second elongated member extends between the layer and the support member, and an exposed portion of each elongated member is exposed through one of the first and second apertures, still further wherein each exposed portion has approximately the same length.

24. The method of claim 19, further comprising:
attaching a microelectronic substrate to the support member; and
electrically coupling the microelectronic substrate to the second connection structure.

25. A method for supporting a microelectronic substrate, comprising:
attaching the microelectronic substrate to a support member having a connection structure with a bond site configured to receive a flowable conductive material, the connection structure further having at least two elongated members connected to and extending outwardly from the bond site, each elongated member being configured to receive at least a portion of the flowable conductive material from the bond site; and
electrically coupling the microelectronic substrate to the support member without electrically coupling the microelectronic substrate to any of the elongated members of the connection structure.

26. The method of claim 25 wherein the connection structure is a first connection structure and the elongated members are first elongated members, and wherein electrically coupling the microelectronic substrate to the support member includes electrically coupling the microelectronic substrate to a second connection structure carried by the support member, the second connection structure having a second bond site configured to receive a flowable conductive material, the second connection structure having second elongated members extending outwardly from the second bond site, wherein each of the second elongated members is configured to receive at least a portion of the flowable conductive material from the second bond site.

27. The method of claim 25 wherein the connection structure is a first connection structure, the bond site is a first bond site and the elongated members are first elongated members configured to receive at least a portion of a flowable conductive material from the first bond site, and wherein the support member includes a second connection structure, the second connection structure having a second bond site configured to receive at least a portion of the flowable conductive material, and wherein the method further comprises:
disposing a first quantity of the flowable conductive material on the first bond site;
wicking a first portion of the first quantity of flowable conductive material along the first elongated members;
disposing a second quantity of the flowable conductive material on the second bond site; and wicking a second portion of the second quantity of flowable conductive material along second elongated members extending outwardly from the second bond site, with the second portion of the flowable conductive material having a volume approximately equal to a volume of the first portion.

28. The method of claim 25 wherein the connection structure is a first connection structure, the bond site is a first bond site and the elongated members are first elongated members configured to receive at least a portion of a flowable conductive material from the first bond site, and wherein the support member includes a second connection structure, the second connection structure having a second bond site configured to receive at least a portion of the flowable conductive material, and wherein the method further comprises:

disposing a first quantity of the flowable conductive material on the first bond site;

wicking a first portion of the first quantity of flowable conductive material along the first elongated members;

disposing a second quantity of the flowable conductive material on the second bond site; and wicking a second portion of the second quantity of flowable conductive material along second elongated members extending outwardly from the second bond site, with the second elongated members being equal in number to the first elongated members.

29. A method for coupling a flowable conductive material to a microelectronic substrate, comprising:

providing a microelectronic substrate having a first surface, a second surface facing opposite from the first surface, and a first bond site positioned at least proximate to the second surface;

disposing a connection structure on the second surface of the microelectronic substrate, the connection structure having a second bond site configured to receive a flowable conductive material, the connection structure further having at least two elongated members connected to and extending outwardly from the second bond site; and disposing a flowable conductive material on the second bond site to form a conductive coupler at the second bond site.

30. The method of claim 29 wherein each elongated member is configured to receive at least a portion of the flowable conductive material from the second bond site, and wherein the method further comprises wicking at least a portion of the flowable conductive material along each elongated member.

31. The method of claim 29, further comprising electrically coupling at least one of the elongated members to the first bond site of the microelectronic substrate.

32. The method of claim 29, further comprising electrically coupling the microelectronic substrate to the connection structure without electrically coupling any of the elongated members extending from the second bond site of the connection structure to any bond sites of the microelectronic substrate.

33. The method of claim 29 wherein disposing the connection structure on the microelectronic substrate includes depositing a metal redistribution layer on the microelectronic substrate.

34. The method of claim 29 wherein the elongated members each have a first surface and a second surface facing opposite from the first surface, and wherein the method further comprises:

disposing a first passivation layer between the second surface of the microelectronic substrate and the first surfaces of the elongated members; and disposing a second passivation layer adjacent to the second surfaces of the elongated members.

35. A method for supporting a microelectronic substrate, comprising:

attaching the microelectronic substrate to a support member having a first surface and a second surface facing opposite from the first surface, the support member further having a connection structure that includes a plurality of first and second bond sites, the first bond sites being positioned at least proximate to the first surface of the support member, the second bond sites being positioned at least proximate to the second surface of the support member, the connection structure further including at least two elongated members connected to and extending outwardly from each of the plurality of first bond sites, at least one of the elongated members being coupled between corresponding first and second bond sites;

electrically coupling at least one of the second bond sites to the microelectronic substrate; and disposing a flowable conductive material on at least one of the first bond sites.

36. The method of claim 35 wherein electrically coupling the second bond site to the microelectronic substrate includes connecting a wire bond between the second bond site and the microelectronic substrate.

37. The method of claim 35 wherein each elongated member is configured to receive at least a portion of a flowable material from the first bond site, and wherein the method further includes wicking at least a portion of the flowable material along each elongated member.

* * * * *